(12) United States Patent
Mita et al.

(10) Patent No.: US 8,080,863 B2
(45) Date of Patent: Dec. 20, 2011

(54) SEMICONDUCTOR DEVICE AND METHOD OF MANUFACTURING THE SAME

(76) Inventors: Keiji Mita, Gunma (JP); Yasuhiro Tamada, Gunma (JP); Kentaro Ooka, Gunma (JP)

( * ) Notice: Subject to any disclaimer, the term of this patent is extended or adjusted under 35 U.S.C. 154(b) by 178 days.

(21) Appl. No.: 11/829,397

(22) Filed: Jul. 27, 2007

(65) Prior Publication Data

US 2008/0023796 A1     Jan. 31, 2008

(30) Foreign Application Priority Data

Jul. 28, 2006   (JP) .................................. 2006-206967

(51) Int. Cl.
*H01L 21/02* (2006.01)
(52) U.S. Cl. ................. 257/607; 257/608; 257/E29.068
(58) Field of Classification Search .................. 257/607, 257/608, E29.068
See application file for complete search history.

(56) References Cited

U.S. PATENT DOCUMENTS 5,389,799 A * 2/1995 Uemoto .......................... 257/77
5,610,415 A * 3/1997 Schulze ......................... 257/149
6,239,463 B1 * 5/2001 Williams et al. ............... 257/328

FOREIGN PATENT DOCUMENTS

| JP | 57-112071 | * | 7/1982 |
| JP | 02-135737 |   | 5/1990 |
| JP | 04-085934 |   | 3/1992 |
| JP | 05-144830 |   | 6/1993 |
| JP | 2004-095781 | * | 3/2004 |

* cited by examiner

*Primary Examiner* — Zandra Smith
*Assistant Examiner* — Jamie C Niesz

(57) ABSTRACT

A conventional semiconductor device, for example, a lateral PNP transistor has a problem that it is difficult to obtain a desired current-amplification factor while maintaining a breakdown voltage characteristic without increasing the device size. In a semiconductor device, that is a lateral PNP transistor, according to the present invention, an N type epitaxial layer is formed on a P type single crystal silicon substrate. The epitaxial layer is used as a base region. Moreover, molybdenum (Mo) is diffused in the substrate and the epitaxial layer. With this structure, the base current is adjusted, and thereby a desired current-amplification factor (hFE) of the lateral PNP transistor is achieved.

4 Claims, 8 Drawing Sheets

FIG.2

| a concentration of a molybdenum(Mo) solution (ppm) | a current-amplification factor(hEF)(Ie=10(μA)) | | a coefficient of variation σ/X (%) |
|---|---|---|---|
| | a mean value(X) | a standard deviation(σ) | |
| 0.0 | 273 | 38.0 | 14 |
| 0.1 | 236 | 13.0 | 6 |
| 1.0 | 201 | 11.0 | 6 |
| 10.0 | 188 | 5.9 | 3 |
| 100.0 | 151 | 8.0 | 5 |

SEMICONDUCTOR DEVICE AND METHOD OF MANUFACTURING THE SAME

Priority is claimed to Japanese Patent Application Number JP2006-206967 filed on Jul. 28, 2006, the disclosure of which is incorporated herein by reference in its entirety.

BACKGROUND OF THE INVENTION

1. Field of the Invention

The present invention relates to a semiconductor device in which a characteristic of a lateral PNP transistor is improved, and to a method of manufacturing the semiconductor device.

2. Description of the Related Art

As an example of a conventional semiconductor device, a following lateral PNP transistor has been known. In the lateral PNP transistor, an N type epitaxial region of a low impurity concentration is formed on a P type semiconductor substrate. An N type impurity buried region is formed so as to extend in the P type semiconductor substrate and the N type epitaxial region. A first N type impurity region is formed in the epitaxial region. The impurity concentration of the first N type impurity region is two to three times higher than that of the N type epitaxial region. Moreover, a second N type impurity region as a base region, a first P type impurity region as an emitter region, a second P type impurity region as a collector region are formed in the first N type impurity region. This technology is described, for instance, in Japanese Patent Application Publication No. Hei 5 (1993)-144830 (Page 2, and FIG. 1).

As another example of the conventional semiconductor device, a following lateral PNP transistor has been known. In the lateral PNP transistor, an N type epitaxial layer is formed on a P type semiconductor substrate. An N type buried diffusion layer is formed so as to extend in the P type semiconductor substrate and the N type epitaxial layer. An N type diffusion layer as a base region, a P type diffusion layer as an emitter region, and a P type diffusion layer as a collector region are formed in the N type epitaxial layer. The P type diffusion layer as the collector region is circularly formed around the P type diffusion layer as the emitter region. This technology is described, for instance, in Japanese Patent Application Publication No. 2004-95781 (Pages 4-5, and FIG. 1).

As an example of a conventional method of manufacturing a semiconductor device, the following method of manufacturing an NPN transistor has been known. Firstly, an N type single crystal silicon substrate is prepared, and a thermal oxide film is formed on the substrate. The thermal oxide film is patterned, and an opening is accordingly formed in the thermal oxide film on a region where a P type diffusion layer is to be formed. Then, a liquid source containing both boron (B) and platinum (Pt) which serves as a lifetime killer substance is applied to the substrate to form a diffusion-source film. Subsequently, the boron (B) and platinum (Pt) are diffused from the diffusion-source film into the substrate by heat treatment at 1000° C. to 1050° C. in a non-oxidation atmosphere. This technology is described, for instance, in Japanese Patent Application Publication No. Hei 2 (1990)-135737 (Pages 2-3, and FIG. 1).

As another example of the conventional method of manufacturing a semiconductor device, the following method of manufacturing a transistor has been known. Firstly, in a semiconductor substrate as a collector, a diffusion layer as a base region, and a diffusion layer as an emitter region are formed. Then, a silicon oxide film is formed on the substrate, and an opening is formed in the silicon oxide film on a region where a diode is to be formed. Subsequently, a liquid source containing platinum (Pt) as a lifetime killer substance is applied to the substrate to form a diffusion-source film. Thereafter, the platinum (Pt) is diffused from the diffusion-source film into the substrate by heat treatment at 800° C. to 1000° C. in a non-oxidation atmosphere. This technology is described, for instance, in Japanese Patent Application Publication No. Hei 4 (1992)-85934 (Page 3, and FIG. 1).

As described above, in the conventional semiconductor device, the first N type impurity region as the base region is formed in the N type epitaxial region. The concentration of the first N type impurity region is two to three times higher than that of the N type epitaxial region. With this structure of the lateral PNP transistor, the concentration of the base region is affected by the concentration of the N type impurity region, and thus the current-amplification factor of the lateral PNP transistor is stabilized. Nevertheless, the first N type impurity region used as the base region has a high impurity concentration, resulting in a problem that the breakdown voltage characteristic of the lateral PNP transistor is deteriorated.

Moreover, in the conventional semiconductor device, the P type diffusion layer as the collector region is circularly formed around the P type diffusion layer as the emitter region in the N type epitaxial layer. This structure makes it possible to efficiently place the P type diffusion layer as the collector region in relation to the P type diffusion layer as the emitter region. Specifically, by reducing the width of the base region (separation distance between the emitter and collector regions), the current-amplification factor of the lateral PNP transistor can be increased. In contrast, when the value of the current-amplification factor of the lateral PNP transistor becomes too high by using the N type epitaxial layer of the low impurity concentration as the base region, it is possible to manage the situation by increasing the width of the base region (separation distance between the emitter and collector regions). In this case, there is a problem that the device size of the lateral PNP transistor becomes too large.

Furthermore, in the conventional method of manufacturing a semiconductor device, the liquid source containing platinum (Pt) as the lifetime killer substance is applied to the substrate to form the diffusion-source film. Thereafter, the platinum (Pt) is diffused from the diffusion-source film into the substrate by heat treatment in the non-oxidation atmosphere. At this time, there is a problem that the use of the platinum (Pt) results in an increase in the specific resistance of the region where the N type impurities are diffused.

SUMMARY OF THE INVENTION

The present invention is made in consideration of the above-described circumstances. A semiconductor device according to the present invention includes a semiconductor layer, and an emitter region, a base region, and a collector region, which are formed in the semiconductor layer. The semiconductor device includes that molybdenum (Mo) is diffused in the semiconductor layer used as the base region. Accordingly, in the present invention, the base current is adjusted by the molybdenum (Mo) diffused in the semiconductor layer, and thereby a desired current-amplification factor is achieved without increasing the device size.

Moreover, a method of manufacturing a semiconductor device according to the present invention includes the steps of forming an insulating layer on a semiconductor layer, and forming an opening in the insulating layer on at least a region where any one of an emitter region and a collector region is to be formed, washing the surface of the semiconductor layer so that the surface exposed to the opening can be hydrophilic, and thereafter applying, to the surface, a solution containing molybdenum (Mo) to be diffused into the semiconductor layer, and applying, to the semiconductor layer, a liquid source containing impurities to form any one of the emitter region and the collector region, and thereafter thermally diffusing the molybdenum (Mo) and the impurities into the semiconductor layer. Accordingly, in the present invention, the molybdenum (Mo) is diffused into the semiconductor layer in the common step of forming at least any one of the emitter region and the collector region. This manufacturing method makes it possible to reduce the variation in the current-amplification factor caused by metallic contamination in a manufacturing line for the semiconductor device.

BRIEF DESCRIPTION OF THE DRAWINGS

FIG. 2 is a table for describing characteristics of the semiconductor device according to this preferred embodiment of the present invention.

DETAILED DESCRIPTION OF THE PREFERRED EMBODIMENTS

Figure 1:
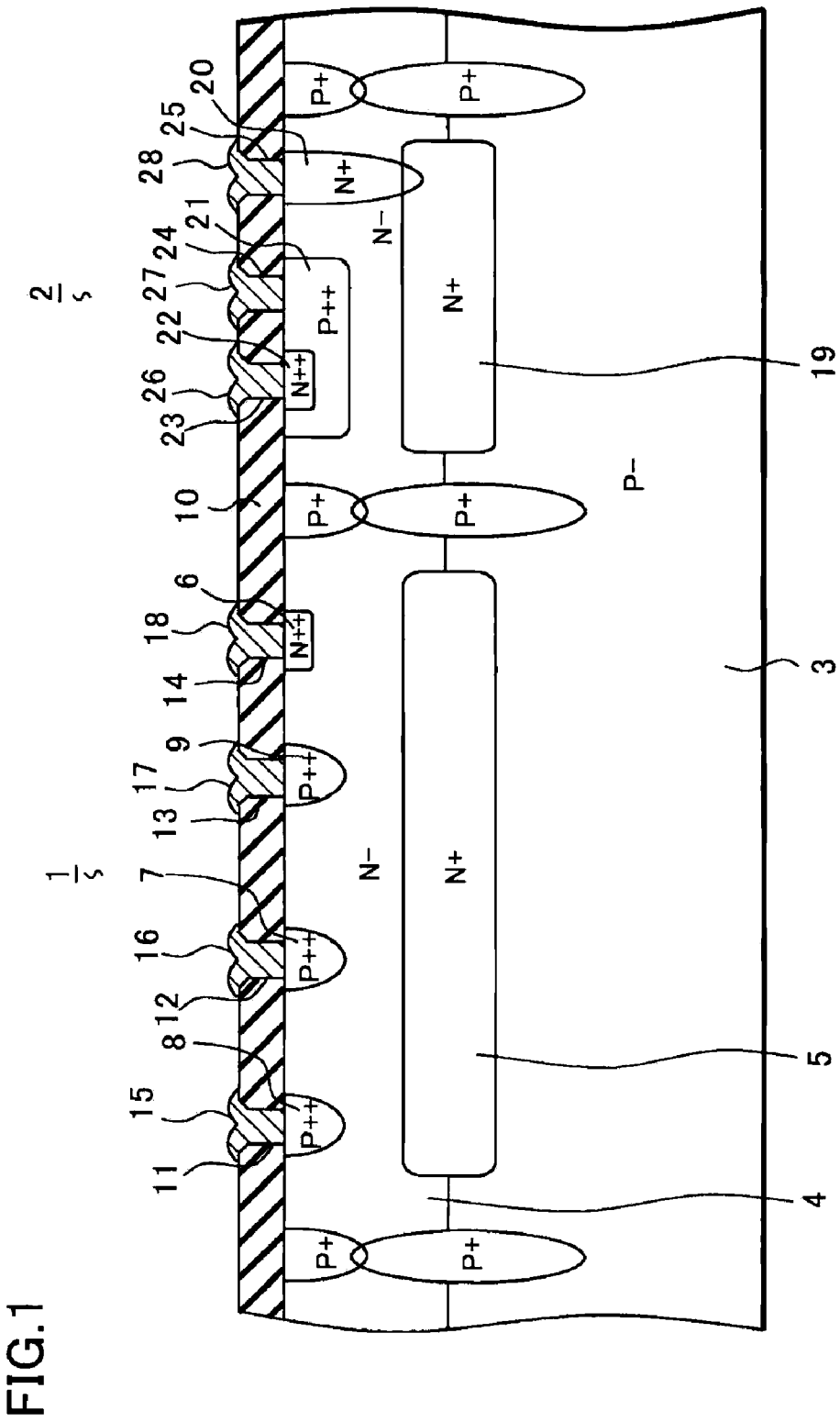
FIG. 1 is a cross-sectional view for describing a semiconductor device according to a preferred embodiment of the present invention.

Hereinafter, description will be given in detail of a semiconductor device according to a preferred embodiment of the present invention with reference to FIG. 1 and FIG. 2. FIG. 1 is a cross-sectional view for describing the semiconductor device according to this preferred embodiment. FIG. 2 is a table for describing the current-amplification factor (hFE) of the semiconductor device according to this preferred embodiment.

As shown in FIG. 1, a lateral PNP transistor 1 mainly includes a P type single crystal silicon substrate 3, an N type epitaxial layer 4 used as a base region, an N type buried diffusion layer 5, an N type diffusion layer 6 used as a base leading region, a P type diffusion layer 7 used as an emitter region, and P type diffusion layers 8 and 9 used as collector regions.

The N type epitaxial layer 4 is formed on the P type single crystal silicon substrate 3. Note that, although only one epitaxial layer 4 is formed on the substrate 3 in this embodiment, the preferred embodiment of the present invention is not limited to this case. For example, the preferred embodiment of the present invention may include only the substrate with no epitaxial layer thereon, or a plurality of epitaxial layers can be stacked on the substrate. Alternatively, the substrate may be an N type single crystal silicon substrate.

The N type buried diffusion layer 5 is formed so as to extend in both regions of the substrate 3 and the epitaxial layer 4. The N type buried diffusion layer 5 is formed across a region where the lateral PNP transistor 1 is formed.

The N type diffusion layer 6 is formed in the epitaxial layer 4. The N type epitaxial layer 4 is used as the base region. The N type diffusion layer 6 is used as the base leading region.

The P type diffusion layer 7 is formed in the epitaxial layer 4, and used as the emitter region.

The P type diffusion layers 8 and 9 are formed in the epitaxial layer 4, and used as the collector regions. Incidentally, the P type diffusion layers 8 and 9 can be circularly formed around the P type diffusion layer 7.

An insulating layer 10 is formed over the epitaxial layer 4. The insulating layer 10 is formed of a PSG (Phospho Silicate Glass) film or the like. In addition, by means of a known photolithography technique, contact holes 11, 12, 13 and 14 are formed in the insulating layer 10 by dry etching using $CHF_3+O_2$ gas, for example.

In each of the contact holes 11, 12, 13 and 14, an aluminum alloy film such as an Al—Si film is selectively formed, so that collector electrodes 15 and 17, an emitter electrode 16, and a base electrode 18 are formed respectively in the contact holes 11, 13, 12 and 14.

On the other hand, an NPN transistor 2 mainly includes, the P type single crystal silicon substrate 3, the N type epitaxial layer 4, an N type buried diffusion layer 19 used as a collector region, an N type diffusion layer 20 used as a collector region, a P type diffusion layer 21 used as a base region, and an N type diffusion layer 22 used as an emitter region.

The N type epitaxial layer 4 is formed on the P type single crystal silicon substrate 3.

The N type buried diffusion layer 19 is formed so as to extend in both regions of the substrate 3 and the epitaxial layer 4.

The N type diffusion layer 20 is formed in the N type epitaxial layer 4. The N type diffusion layer 20 is connected to the N type buried diffusion layer 19, and used as the collector region. The N type epitaxial layer 20 and the N type buried diffusion layer 19 are formed so as to be connected to each other.

The P type diffusion layer 21 is formed in the N type epitaxial layer 4, and used as the base region.

The N type diffusion layer 22 is formed as overlapped with the P type diffusion layer 21.

The insulating layer 10 is formed over the epitaxial layer 4. In addition, by means of the known photolithography technique, contact holes 23, 24 and 25 are formed in the insulating layer 10 by dry etching using $CHF_3+O_2$ gas, for example.

In each of the contact holes 23, 24 and 25, an aluminum alloy film such as an Al—Si film is selectively formed, so that an emitter electrode 26, a base electrode 27, and a collector electrode 28 are formed respectively in the contact holes 23, 24 and 25.

Although the specifics will be explained in the description of a method of manufacturing a semiconductor device later, molybdenum (Mo) is diffused in the substrate 3 and the epitaxial layer 4 used as the base region of the lateral PNP transistor 1. In the lateral PNP transistor 1, holes are injected from the P type diffusion layer 7 as the emitter region to the epitaxial layer 4 as the base region. Then, the holes flow into the P type diffusion layers 8 and 9 as the collector regions via the vicinity of the surface of the epitaxial layer 4 where the base width (Wb) is the narrowest. At this time, the hole is a minor carrier in the N type epitaxial layer 4, and easy to recombine with electrons because of the molybdenum (Mo) in the epitaxial layer 4. In other words, the lifetime of the hole is reduced by the accelerating effect on the recombination of the molybdenum (Mo). Thereby, the current-amplification factor (hFE) of the lateral PNP transistor 1 is reduced.

Specifically, as shown in FIG. 2, the current-amplification factor (hFE) of the lateral PNP transistor 1 is reduced in accordance with the diffusion amount of the molybdenum (Mo) in the epitaxial layer 4. Note that, FIG. 2 shows the mean value (X) of the current-amplification factor (hFE) in a case where the emitter current (Ie) in the lateral PNP transistor 1 is 10 μA.

As shown in FIG. 2, in a case where molybdenum (Mo) is not diffused into the lateral PNP transistor 1, the mean value (X) of the current-amplification factor (hFE) of the lateral PNP transistor 1 is 273. In the meanwhile, in a case where the molybdenum (Mo) solution in a concentration of 0.1 ppm is used (refer to the description of FIG. 7), the mean value (X) is 236. In addition, in a case of 1.0 ppm, the mean value (X) is 201. Moreover, in a case of 10.0 ppm, the mean value (X) is 188. Furthermore, in a case of 100.0 ppm, the mean value (X) is 151. More specifically, as the diffusion amount of the molybdenum (Mo) in the epitaxial layer 4 is increased, the current-amplification factor (hFE) of the lateral PNP transistor 1 is reduced.

Note that, although various semiconductor elements are formed on the substrate 3, the molybdenum (Mo) does not influence the characteristics of the other semiconductor elements. Thereby, the concentration of the molybdenum solution can be determined in accordance with the current-amplification factor (hFE) characteristic of the lateral PNP transistor 1. Particularly, even when molybdenum is diffused into the substrate 3 and the epitaxial layer 4, no increase is observed in the specific resistance, or in the on-resistance of the lateral PNP transistor 1 and the other semiconductor elements either.

Furthermore, as shown in FIG. 2, the coefficient of variation ($\sigma/X$) of the current-amplification factor (hFE) of the lateral PNP transistor 1 is reduced in accordance with the diffusion amount of molybdenum (Mo) in the epitaxial layer 4. Note that, FIG. 2 shows the mean value (X) and the standard deviation ($\sigma$) of the current-amplification factor (hFE) in a case where the emitter current (Ie) in the lateral PNP transistor 1 is 10 μA.

As shown in FIG. 2, in a case where molybdenum (Mo) is not diffused into the epitaxial layer 4, the standard deviation ($\sigma$) of the current-amplification factor (hFE) of the lateral PNP transistor 1 is 38.0, and the coefficient of variation ($\sigma/X$) is 14%. In the meanwhile, in a case where the molybdenum (Mo) solution in a concentration of 0.1 ppm is used (refer to the description of FIG. 7), the standard deviation ($\sigma$) is 13.0, and the coefficient of variation ($\sigma/X$) is 6%. In addition, in a case of 1.0 ppm, the standard deviation (v) is 11.0, and the coefficient of variation ($\sigma/X$) is 6%. Moreover, in a case of 10.0 ppm, the standard deviation ($\sigma$) is 5.9, and the coefficient of variation ($\sigma/X$) is 3%. Furthermore, in a case of 100.0 ppm, the standard deviation ($\sigma$) is 8.0, and the coefficient of variation ($\sigma/X$) is 5%. More specifically, it is possible to avoid the adverse influence from the metallic contamination in a manufacturing line for the semiconductor device by diffusing a certain amount of molybdenum (Mo) into the epitaxial layer 4. This is because the molybdenum (Mo) is diffused into the epitaxial layer 4 more than the amount of the metallic contamination in the manufacturing line, and thereby the variation in the current-amplification factor (hFE) of the lateral PNP transistor 1 is reduced.

As described above, in the lateral PNP transistor 1, by utilizing the accelerating effect on the recombination with the molybdenum (Mo), the lifetime of the hole is reduced, and the current-amplification factor (hFE) is reduced. Thereby, a desired current-amplification factor (hFE) is obtained. At this time, since the impurity concentration of the N type epitaxial layer 4 is not set high, it is possible to prevent the breakdown voltage characteristic of the lateral PNP transistor 1 from deteriorating. Furthermore, by reducing the current-amplification factor (hFE) without increasing the base width (separation distance between the emitter and collector regions) of the lateral PNP transistor 1, it is also possible to prevent the device size of the lateral PNP transistor 1 from increasing.

Next, description will be given in detail of a method of manufacturing a semiconductor device according to another preferred embodiment of the present invention with reference to FIGS. 3 to 8. FIGS. 3 to 8 are cross-sectional views for describing the method of manufacturing the semiconductor device shown in FIG. 1 according to this preferred embodiment.

Figure 3:
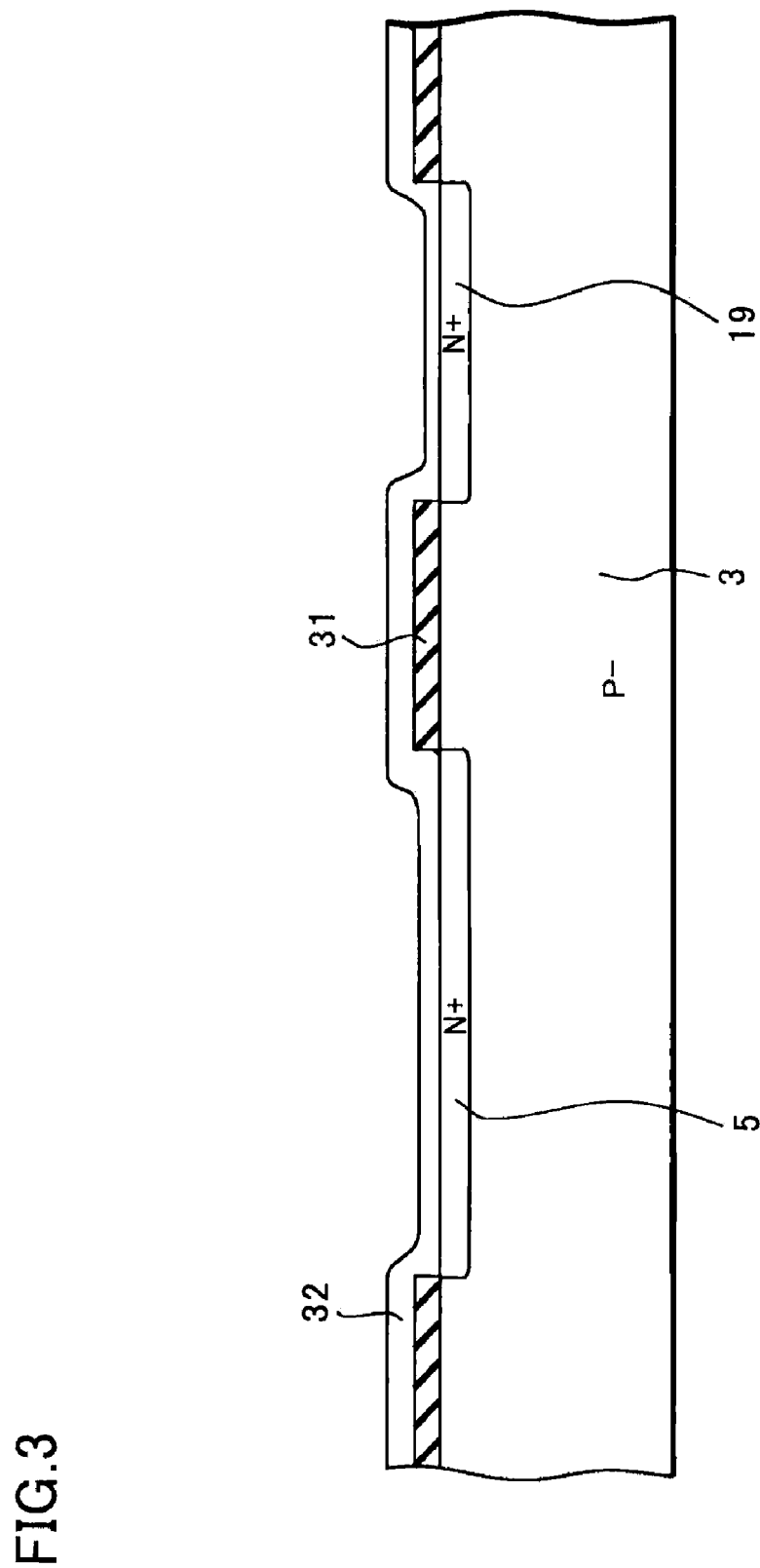
FIG. 3 is a cross-sectional view for describing a method of manufacturing a semiconductor device according to another preferred embodiment of the present invention.

Firstly, as shown in FIG. 3, a P type single crystal silicon substrate 3 is prepared. The surface of the substrate 3 is thermally oxidized to form a silicon oxide film 31 thereon. Then, the silicon oxide film 31 is selectively removed, so that openings are formed on regions where N type buried diffusion layers 5 and 19 are to be formed. Subsequently, by using the silicon oxide film 31 as a mask, a liquid source 32 containing an N type impurity, for example, antimony (Sb) is applied to the surface of the substrate 3 by means of a spin-coating method. Thereafter, the antimony (Sb) is thermally diffused, so that the N type buried diffusion layers 5 and 19 are formed. After that, the silicon oxide film 31 and the liquid source 32 are removed.

Figure 4:
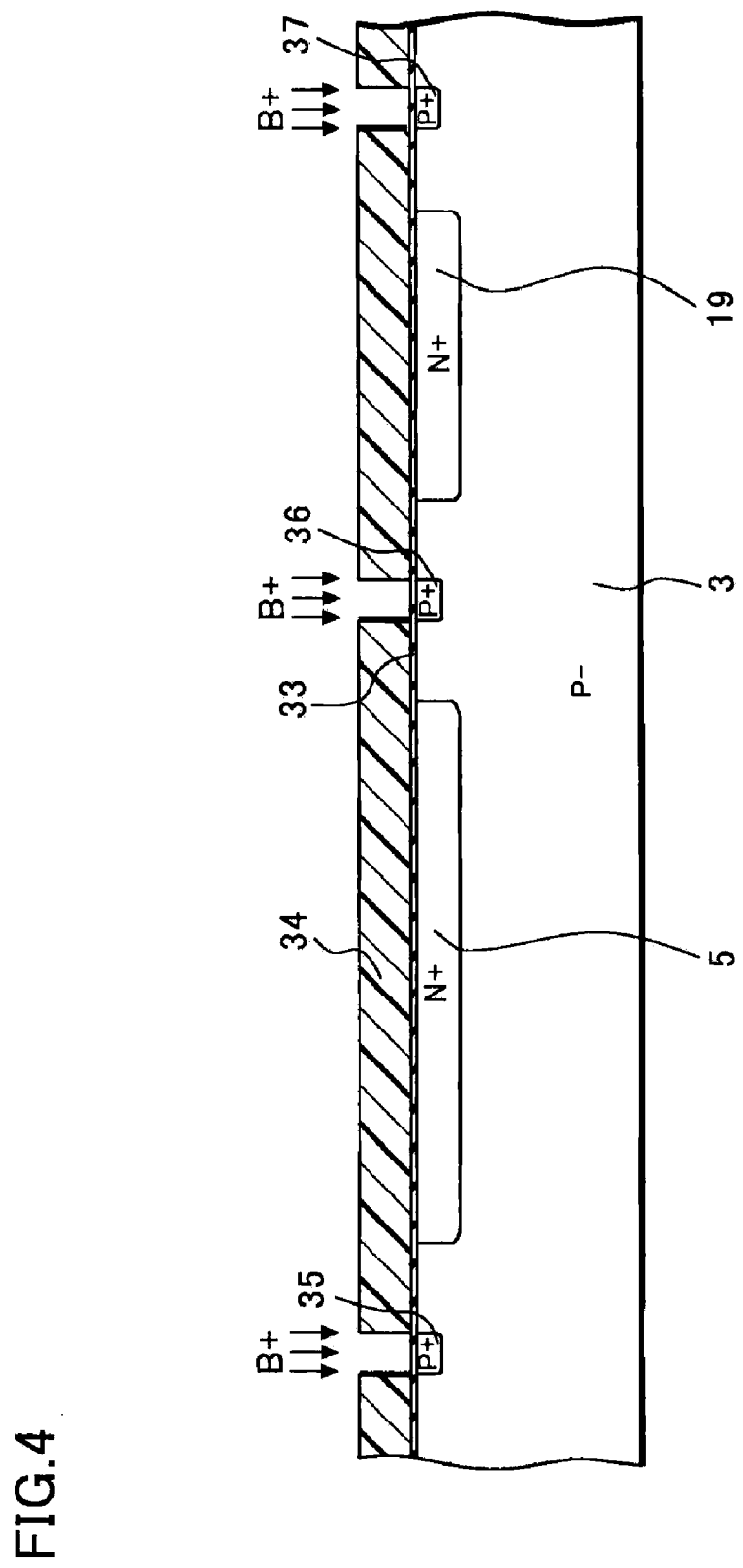
FIG. 4 is a cross-sectional view for describing the method of manufacturing a semiconductor device according to this preferred embodiment of the present invention.

Next, as shown in FIG. 4, a silicon oxide film 33 is deposited to a thickness of, for example, 100 Å to 450 Å on the substrate 3. Then, a photoresist 34 is formed on the silicon oxide film 33. Thereafter, by means of a known photolithography technique, openings are formed in the photoresist 34 on regions where P type buried diffusion layers 35 to 37 are to be formed. Subsequently, ions of a P type impurity, for example, boron (B) are implanted from the surface of the substrate 3 at an accelerating voltage of 90 to 180 (keV) and a dose of $0.5 \times 10^{14}$ to $1.0 \times 10^{16}$ (/cm$^2$). After that, the photoresist 34 is removed, and then the P type buried diffusion layers 35 to 37 are formed by thermal diffusion.

Figure 5:
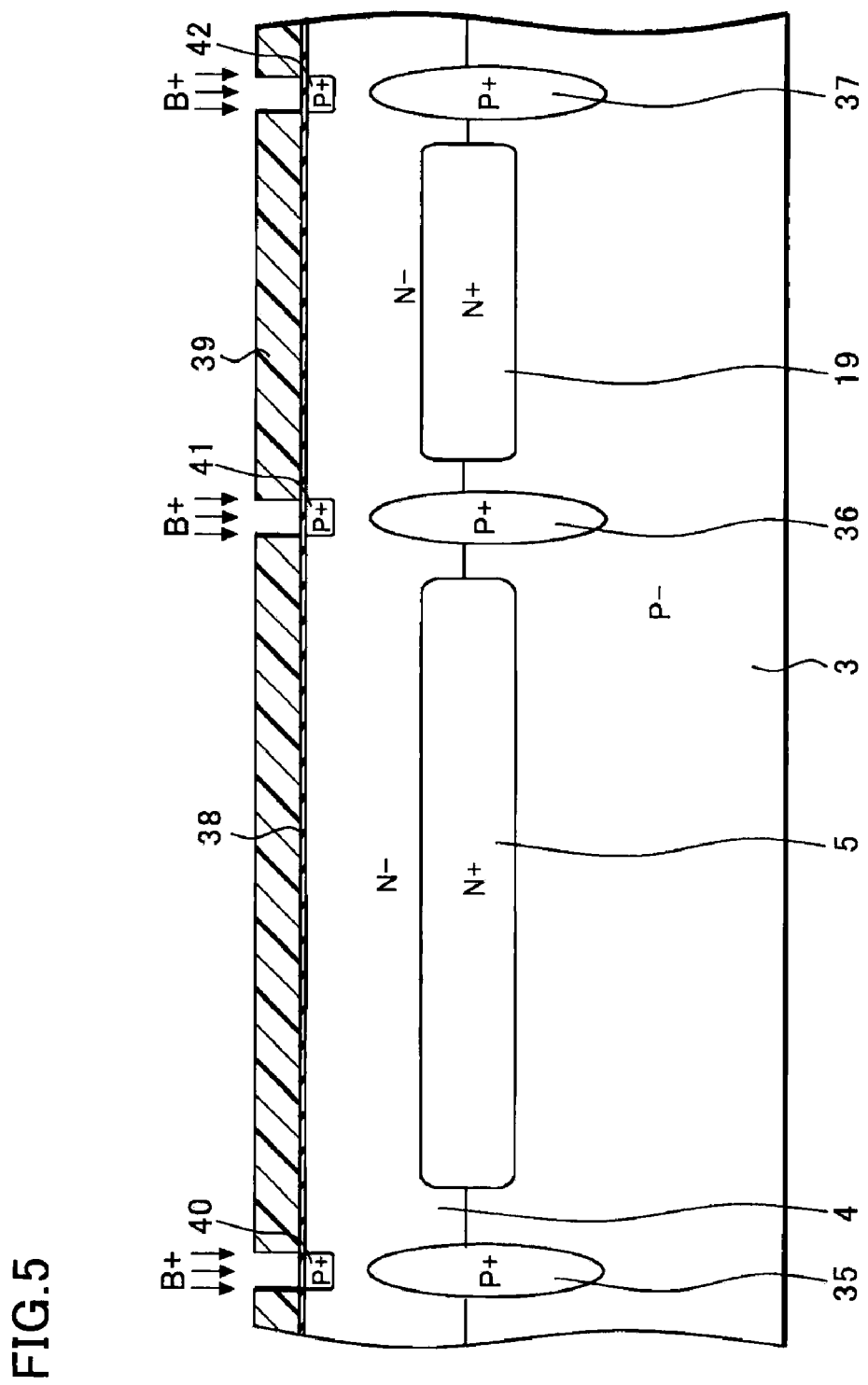
FIG. 5 is a cross-sectional view for describing the method of manufacturing a semiconductor device according to this preferred embodiment of the present invention.

Next, as shown in FIG. 5, the substrate 3 is placed on a susceptor of a vapor phase epitaxial growth apparatus so as to form an epitaxial layer 4 on the substrate 3. The vapor phase epitaxial growth apparatus mainly includes a gas supply system, a reactor, an exhaust system, and a control system. In this embodiment, by use of a vertical reactor, the thickness uniformity of the epitaxial layer can be improved. The N type impurities in the N type buried diffusion layers 5 and 19 as well as the P type impurities in the P type buried diffusion layers 35 to 37 are thermally diffused by heat treatment in the process of forming the epitaxial layer 4.

Next, a silicon oxide film 38 is deposited to a thickness of, for example, 100 Å to 450 Å on the epitaxial layer 4. Then, a photoresist 39 is formed on the silicon oxide film 38. Thereafter, by means of the known photolithography technique, openings are formed in the photoresist 39 on regions where P type diffusion layers 40 to 42 are to be formed. Subsequently, ions of a P type impurity, for example, boron (B) are implanted from the surface of the epitaxial layer 4 at an accelerating voltage of 90 to 180 (keV) and a dose of $0.5 \times 10^{14}$ to $1.0 \times 10^{16}$ (/cm$^2$). After that, the photoresist 39 is removed, and then the P type diffusion layers 40 to 42 are formed.

Figure 6:
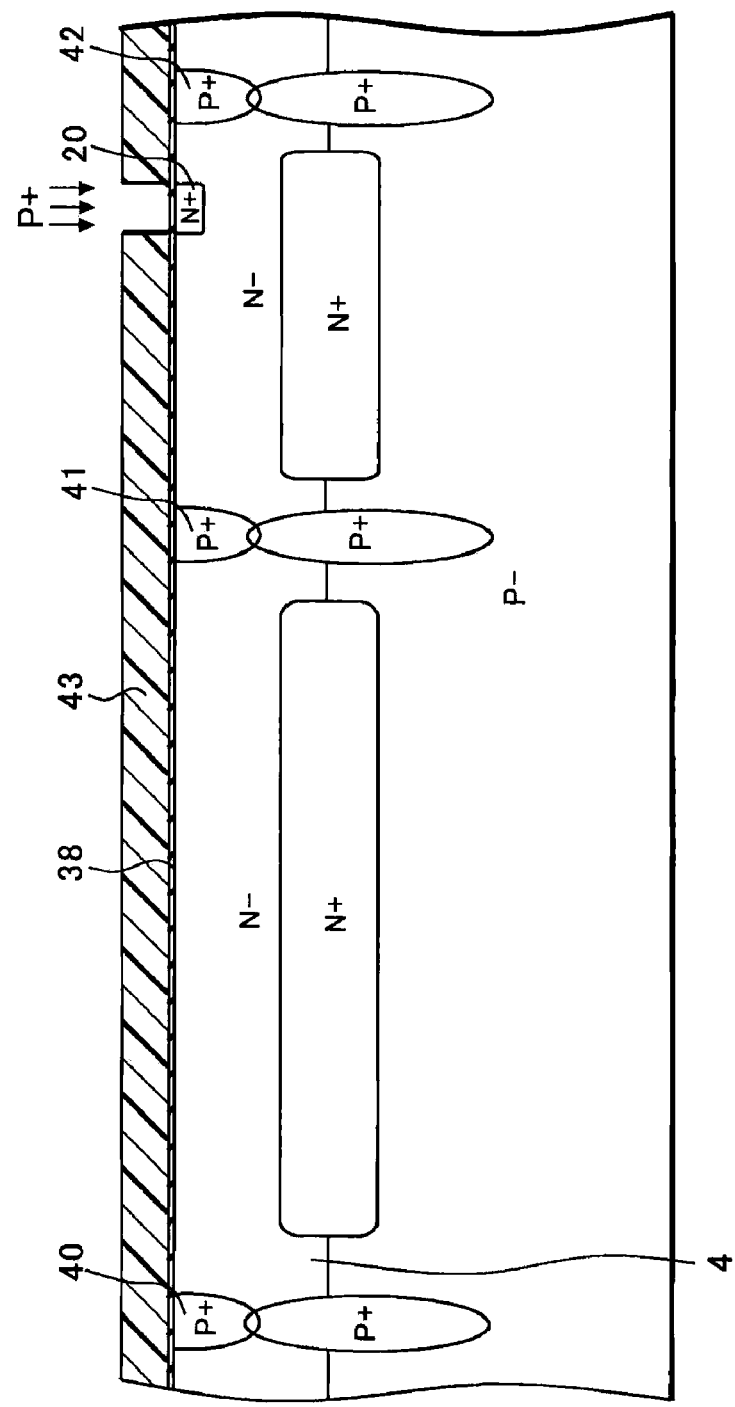
FIG. 6 is a cross-sectional view for describing the method of manufacturing a semiconductor device according to this preferred embodiment of the present invention.

Next, as shown in FIG. 6, a photoresist 43 is formed on the silicon oxide film 38. Thereafter, by means of the known photolithography technique, opening is formed in the photoresist 43 on regions where an N type diffusion layer 20 is to be formed. Subsequently, by using the photoresist 43 as a mask, ions of an N type impurity, for example, phosphorus (P) are implanted from the surface of the epitaxial layer 4 at an accelerating voltage of 90 to 110 (keV) and a dose of $1.0 \times 10^{13}$ to $1.0 \times 10^{15}$ (/cm$^2$). After that, the silicon oxide film 38 and the photoresist 43 are removed, and then the N type diffusion layer 20 is formed by thermally diffusing the phosphorus.

Figure 7:
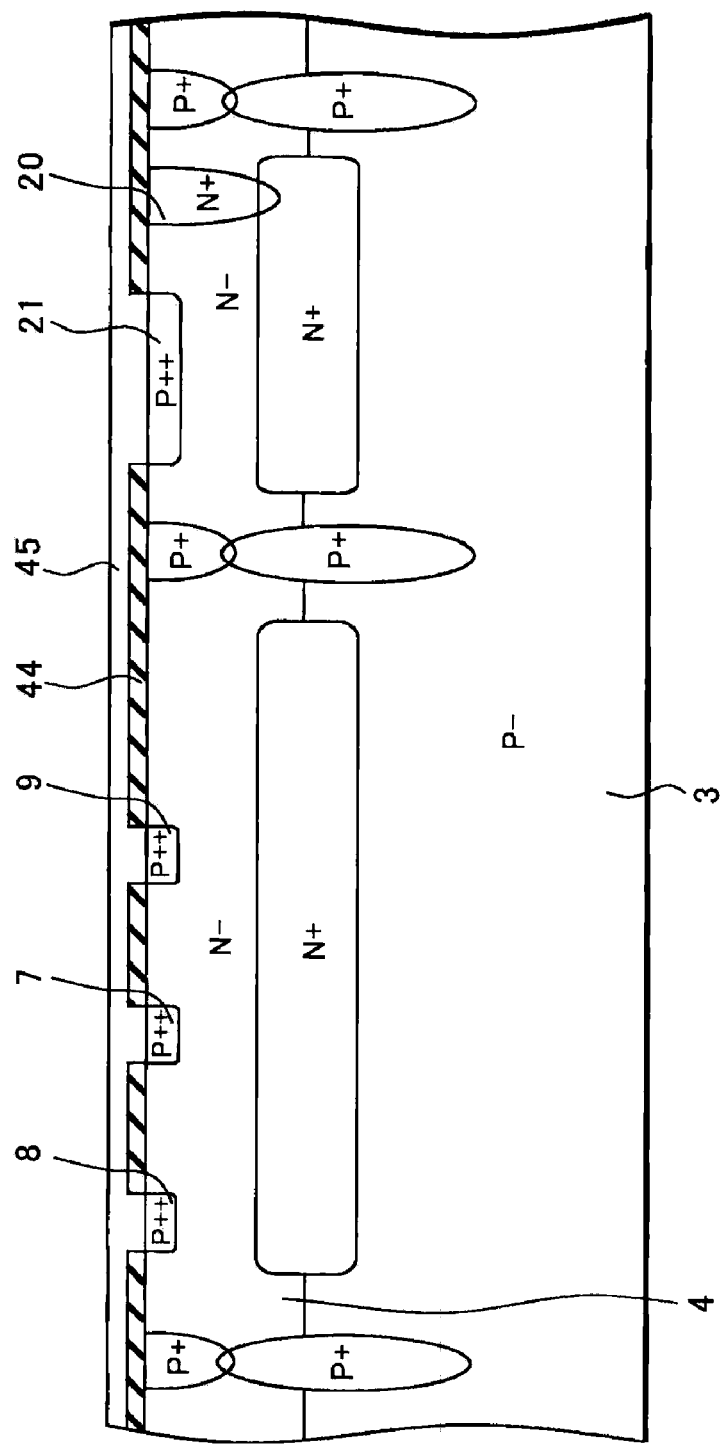
FIG. 7 is a cross-sectional view for describing the method of manufacturing a semiconductor device according to this preferred embodiment of the present invention.

Next, as shown in FIG. 7, the surface of the epitaxial layer 4 is thermally oxidized to form a silicon oxide film 44 thereon. The silicon oxide film 44 is selectively removed, so that openings are formed on regions where P type diffusion layers 7, 8, 9 and 21 are to be formed. Subsequently, by washing an unillustrated wafer on which the epitaxial layer 4 is formed, the regions of the surface of the epitaxial layer 4 exposed to the openings in the silicon oxide film 44 are made hydrophilic.

Thereafter, approximately 10 ml of a molybdenum (Mo)-containing solution (solution made by dissolving molybdenum trioxide in ammonium water) is applied to the surface of the epitaxial layer 4 by means of the spin-coating method. Then, the surface of the wafer is dried by rotating the wafer. Subsequently, a liquid source 45 containing a P type impurity, for example, boron (B) is applied to the surface of the epitaxial layer 4 by means of the spin-coating method. Thereafter, the molybdenum (Mo) and the boron (B) are thermally diffused simultaneously, so that P type diffusion layers 7, 8, 9 and 21 are formed. At this time, the molybdenum (Mo) is diffused into the substrate 3 and the epitaxial layer 4 simultaneously. After that, the silicon oxide film 44 and the liquid source 45 are removed. Note that, it is only necessary that the molybdenum (Mo) be diffused into at least the epitaxial layer 4.

Figure 8:
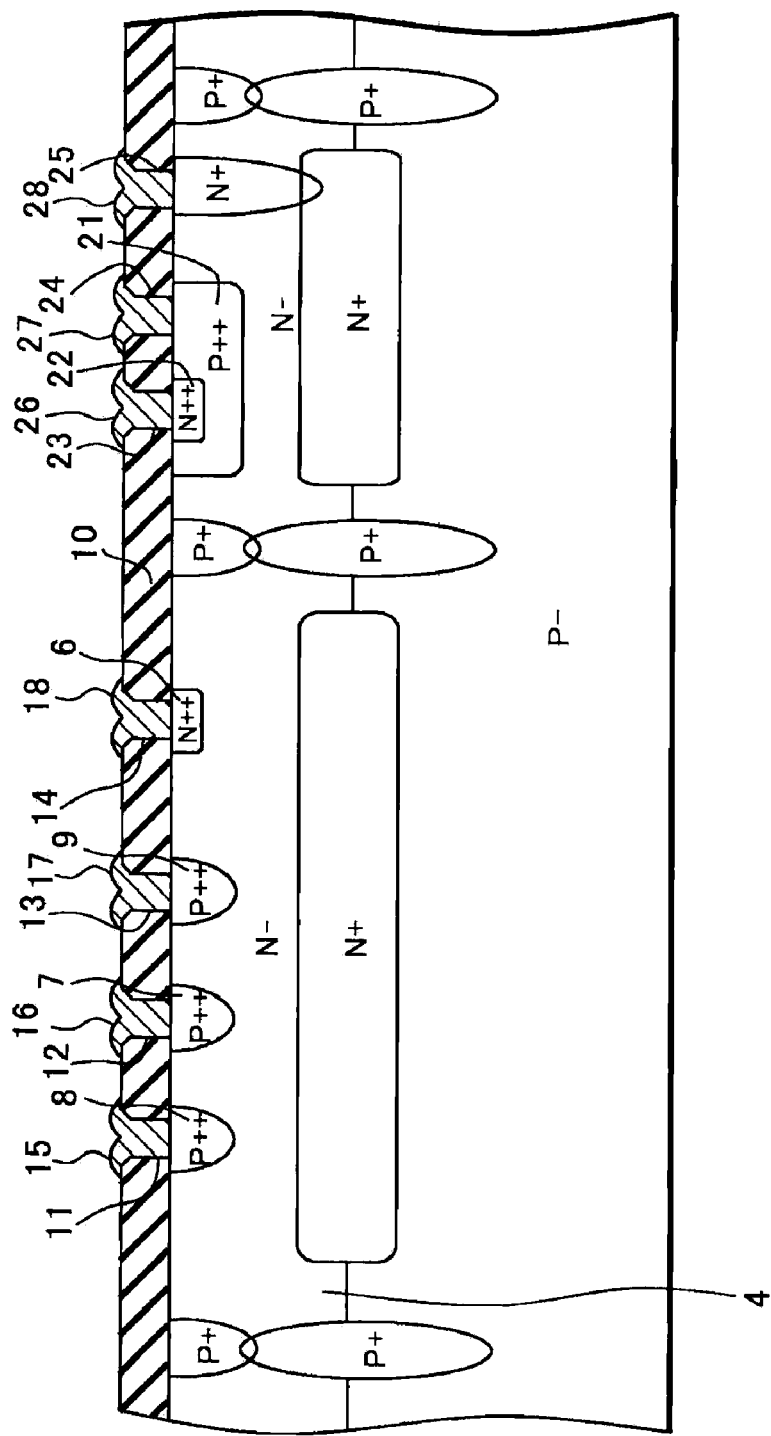
FIG. 8 is a cross-sectional view for describing the method of manufacturing a semiconductor device according to this preferred embodiment of the present invention.

Next, as shown in FIG. 8, by means of the known photolithography technique, N type diffusion layers 6 and 22 are formed by a desired forming method. Then, a PSG film or the like is deposited as an insulating layer 10 over the epitaxial layer 4. Subsequently, by means of the known photolithography technique, contact holes 11, 12, 13, 14, 23, 24 and 25 are formed in the insulating layer 10 by dry etching using CHF$_3$+O$_2$ gas, for example. In each of the contact holes 11, 12, 13, 14, 23, 24 and 25, an aluminum alloy film such as an Al—Si film is selectively formed, so that collector electrodes 15, 17 and 28 and emitter electrodes 16 and 26 as well as base electrodes 18 and 27 are formed respectively in the contact holes 11, 13, 25, 12, 23, 14 and 24.

Note that, in this embodiment, description has been given of the case where the molybdenum (Mo) is diffused into the substrate 3 and the epitaxial layer 4 in the common step of forming the P type diffusion layers 7, 8, 9 and 21. However, the preferred embodiment of the present invention is not limited to this case. For example, the molybdenum (Mo) can be diffused into the substrate 3 and the epitaxial layer 4 in a common step of forming a P type diffusion layer for an isolation region in the epitaxial layer 4. Additionally, in this embodiment, description has been given of the case where the solution containing the molybdenum (Mo) is applied by the spin-coating method. However, the preferred embodiment of the present invention is not limited to this case. The molybdenum (Mo) may be diffused into the substrate 3 and the epitaxial layer 4 by means of, for example, an ion implantation method, a method to immerse the wafer into the solution containing molybdenum (Mo), or a method to make the liquid source 45 containing boron (B) include a molybdenum (Mo) compound, and to diffuse the molybdenum (Mo) together with the boron (B). Moreover, various modifications are possible to be made on the preferred embodiment of the present invention without departing from the spirit of the present invention.

The molybdenum (Mo) is diffused into the base region of the lateral PNP transistor according to the preferred embodiment of the present invention. With the structure, holes injected from the emitter and electrons which are majority carriers in the base region are recombined with each other via the deep level of molybdenum (Mo), and thereby a desired current-amplification factor (hFE) of the lateral PNP transistor is achieved.

Moreover, according to the preferred embodiment of the present invention, the holes injected from the emitter and the electrons which are the majority carriers in the base region are recombined with each other via the deep level of molybdenum (Mo), and thereby a desired current-amplification factor (hFE) of the lateral PNP transistor is achieved. Thus, it is possible to prevent the device size of the lateral PNP transistor from increasing.

Furthermore, according to the preferred embodiment of the present invention, the holes injected from the emitter and the electrons which are the majority carriers in the base region are recombined with each other via the deep level of molybdenum (Mo), and thereby a desired current-amplification factor (hFE) of the lateral PNP transistor is achieved. Accordingly, the diffusion of the molybdenum (Mo) makes possible to reduce the variation in the current-amplification factor (hFE) caused by metallic contamination in a manufacturing line for the semiconductor device.

What is claimed is:

1. A semiconductor device comprising:
   a silicon substrate of one conductivity type; and
   an epitaxial layer of an opposite conductivity type on the substrate, wherein an emitter region, a base region and a collector region are in the epitaxial layer and
   molybdenum (Mo) is diffused through the entire thickness of the epitaxial layer and the substrate.

2. The semiconductor device according to claim 1, wherein the collector region, the base region, and the emitter region are arranged as a lateral PNP transistor,
   the collector region surrounds the emitter region, and
   a distance separating the emitter region from the collector region corresponds to a width of the base region.

3. The semiconductor device according to claim 1, wherein an opposite conductivity type impurity in the epitaxial layer comprises antimony (Sb).

4. The semiconductor device according to claim 1, wherein the epitaxial layer is silicon.

* * * * *